United States Patent
Masuko

(10) Patent No.: US 6,610,621 B2
(45) Date of Patent: Aug. 26, 2003

(54) GLASS-CERAMIC COMPOSITION FOR CERAMIC ELECTRONIC PART, CERAMIC ELECTRONIC PART, AND METHOD FOR MANUFACTURING MULTILAYER CERAMIC ELECTRONIC PART

(75) Inventor: Kenji Masuko, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 52 days.

(21) Appl. No.: 09/996,547

(22) Filed: Nov. 28, 2001

(65) Prior Publication Data

US 2002/0098330 A1 Jul. 25, 2002

(30) Foreign Application Priority Data

Nov. 29, 2000 (JP) ........................................ 2000-362079
Sep. 11, 2001 (JP) ........................................ 2001-275084

(51) Int. Cl.[7] ........................... C03C 14/00; B32B 18/00
(52) U.S. Cl. .............................. 501/32; 501/65; 501/66; 501/77; 501/78; 428/210; 264/619; 156/89.12
(58) Field of Search ............................ 501/32, 65, 66, 501/77, 78; 428/210; 264/619; 156/89.12

(56) References Cited

U.S. PATENT DOCUMENTS

| | | | |
|---|---|---|---|
| 4,777,092 A | 10/1988 | Kawakami et al. ......... 428/428 |
| 5,212,121 A | 5/1993 | Omata et al. ................. 501/32 |
| 5,468,694 A | 11/1995 | Taguchi et al. ............... 501/77 |
| 6,136,734 A | * 10/2000 | Jean et al. ..................... 501/32 |
| 6,376,055 B1 | * 4/2002 | Kishida et al. ............. 428/210 |
| 6,448,195 B2 | * 9/2002 | Kishida et al. ............... 501/32 |
| 6,534,161 B1 | * 3/2003 | Kawakami et al. ......... 428/210 |

FOREIGN PATENT DOCUMENTS

| | | |
|---|---|---|
| JP | 02-212336 | 8/1990 |
| WO | WO 00/04577 | 1/2000 |

OTHER PUBLICATIONS

Abstract of Japanese Publication No. 02212336 A, Aug. 1990.
Copy of German Search Report dated Mar. 13, 2003 (and English translation of same).

* cited by examiner

Primary Examiner—Karl Group
(74) Attorney, Agent, or Firm—Dickstein, Shapiro, Morin & Oshinsky, LLP.

(57) ABSTRACT

When ceramic electronic parts such as multilayer ceramic substrates that have a substrate body and metal wiring conductors comprising silver are manufactured, a composition comprising not only a borosilicate glass powder and a ceramic powder, but also an additive powder comprising at least one of cerium oxide, bismuth, bismuth oxide, antimony and antimony oxide is used as a composition for preparing the substrate body. Gray discoloration of the substrate body and yellow discoloration in the vicinities of the metal wiring conductors can be prevented.

19 Claims, 2 Drawing Sheets

GLASS-CERAMIC COMPOSITION FOR CERAMIC ELECTRONIC PART, CERAMIC ELECTRONIC PART, AND METHOD FOR MANUFACTURING MULTILAYER CERAMIC ELECTRONIC PART

BACKGROUND OF THE INVENTION

1. Field of the Invention

The present invention relates to a glass-ceramic composition (a composition for preparing a substrate body) for ceramic electronic parts, a ceramic electronic part, and a method for manufacturing a multilayer ceramic electronic part. In particular, the present invention relates to a glass-ceramic composition that can be sintered at a low temperature of not more than about 1,000° C., a ceramic electronic part such as a multilayer ceramic substrate and a thick-film hybrid circuit part that is composed of the composition, and a method for manufacturing a multilayer ceramic electronic part.

2. Description of the Related Art

Multilayer ceramic electronic parts such as multilayer ceramic substrates are used in various electronic apparatuses, including mobile information terminal devices and personal computers, for example. The multilayer ceramic electronic parts have an advantage in that they make it possible to miniaturize the electronic apparatuses and to realize a higher wiring density.

The multilayer ceramic electronic parts have metal wiring conductors on the inside, and therefore, the metal wiring conductors are exposed to the same baking conditions in the baking step as the ceramic substrate bodies to be used for the multilayer ceramic electronic parts. Accordingly, metal materials constituting the metal wiring conductors must stand such simultaneous baking.

Conventionally, alumina is generally used as a material for a substrate body for use in the multilayer ceramic electronic parts. Since a temperature as high as about 1,600° C. is necessary for baking alumina, a high melting-point metal such as tungsten and molybdenum must be used as the metal material for the metal wiring conductors that are to be baked at the same time. However, since a metal as tungsten or molybdenum has a high electric resistance and alumina has a high dielectric constant, the requirement of higher frequencies cannot be fully met at present by electronic apparatuses in which such multilayer ceramic electronic parts are used.

Accordingly, it is desired to use such a metal as gold, silver, copper, silver-palladium, silver-platinum, nickel or aluminum that has a relatively low electric resistance for the metal wiring conductors. However, since these metals have a relatively low melting point, it is necessary that materials for the substrate bodies must be capable of being baked at a temperature of not more than about 1,000° C. Glass-ceramic materials are supplied for practical use, as a representative of the materials for preparing substrate bodies that can be baked at such a relatively low temperature.

In general, when multilayer ceramic electronic parts such as multilayer ceramic substrates are manufactured using a glass-ceramic material as a material for preparing substrate bodies, the glass-ceramic slurry is prepared by fully mixing a glass powder and a ceramic powder together with an organic vehicle at a specific ratio, and is subjected to a sheet forming process according to a doctor blade method or the like so as to prepare glass-ceramic green sheets. Next, electroconductive films and electroconductive via holes that are to act as metal wiring conductors are formed on specific glass-ceramic green sheets by means of screen printing or the like. Then, these plural glass-ceramic green sheets are laminated (stacked) to form a green laminate and the green laminate is subjected to pressing, followed by baking, to form a multilayer ceramic electronic part such as a multilayer ceramic substrate. Regarding the electroconductive films constituting part of the metal wiring conductors, those located on the external surfaces may be formed after the baking.

As a material for the above-described metal wiring conductors, for example, gold, silver, copper, silver-palladium, silver-platinum, nickel, aluminum or the like is used as described above. Especially, silver or silver alloys are advantageously used as a material for the metal wiring conductors since they have a small specific resistance and they can be baked in air.

Regarding a glass-ceramic composition that can be sintered at a low temperature of not more than about 1,000° C. and that can be baked at the same time with metal wiring conductors containing a low-resistance metal such as silver or copper, a glass-ceramic composition having the following constitution is proposed in Japanese Published Patent Application No. 2000-351688(corresponding to U.S. application Ser. No. 09/550,826 which is now U.S. Pat. No. 6,376,055, and EP 1059271): a borosilicate glass powder comprising from 5% to 17.5% by weight of $B_2O_3$, from 28% to 44% by weight of $SiO_2$, from 0% to 20% by weight of $Al_2O_3$ and from 36% to 50% by weight of at least one of CaO, MgO and BaO, as well as a ceramic powder such as an alumina powder.

When a substrate body is prepared by using such a glass-ceramic composition, it can have a high mechanical strength and a low dielectric constant, and therefore, a ceramic electronic part such as a multilayer ceramic substrate having good properties and high reliability can be obtained by using this substrate body. Furthermore, since the substrate body can have a coefficient of thermal expansion of not less than 6.0 ppm/° C., matching the coefficient of thermal expansion with that of a printed wiring substrate made of an epoxy resin or the like is well-established, and accordingly, a high connection reliability can be achieved.

However, when a glass-ceramic composition having such a specific constitution is used for manufacturing ceramic electronic parts, the substrate body made from the composition sometimes develops a gray color instead of a white color that is an attribute that the substrate body is expected to have inherently. It is considered that this is caused by the fact that carbon generated from an organic binder contained in the glass-ceramic green sheets is not completely burnt out in the baking step, and is left in the substrate body.

Furthermore, there are occasions when discoloration into yellow or other colors occurs in the vicinities of the metal wiring conductors of ceramic electronic parts. This phenomenon occurs particularly when the metal wiring conductors are formed from a silver-containing metal, and it is supposed to be caused by diffusion of silver from the metal wiring conductors into the substrate body during the baking step.

The above-described gray discoloration of the substrate body and discoloration into yellow or other colors in the vicinities of metal wiring conductors do not exert direct influence on the electrical properties of the obtained ceramic electronic parts. However, in some cases, such discoloration will result in fluctuation in color of the merchandise, degrading its commercial value.

SUMMARY OF THE INVENTION

Accordingly, it is an object of the present invention to provide a glass-ceramic composition for ceramic electronic parts, a ceramic electronic part formed by using this composition, and a method for manufacturing a multilayer ceramic electronic part, in order to solve the problems described above.

According to one aspect of the present invention, provided is a glass-ceramic composition for ceramic electronic parts comprising a borosilicate glass powder comprising from about 5% to 17.5% by weight of $B_2O_3$, from about 28% to 44% by weight of $SiO_2$, from 0% to about 20% by weight of $Al_2O_3$ and from about 36% to 50% by weight of MO where MO is at least one selected from the group consisting of CaO, MgO and BaO, as well as a ceramic powder, and for solving the above-described technical problems, the present invention is characterized in that the composition also contains an additive powder containing at least one selected from the group consisting of cerium oxide, bismuth, bismuth oxide, antimony, and antimony oxide.

The content of the above-described additive powder is preferably in the range of about 0.005% to 5% by weight based on the total weight of the borosilicate glass powder and the ceramic powder. It is more preferably in the range of about 0.01% to 1% by weight.

The average particle size of the additive powder is preferably in the range of about 0.1 to 20 $\mu$m.

The ratio of the borosilicate glass powder to the ceramic powder is preferably from about 40:60 to 49:51 by weight.

The ceramic powder preferably contains an alumina powder.

According to another aspect of the present invention, a ceramic electronic part is provided that comprises a substrate body obtained by molding from the above-described glass-ceramic composition, followed by baking, as well as metal wiring conductors formed in association with (for example, on, in, through, between, and/or over) the substrate body and baked at the same time with the composition.

The ceramic electronic part may be a multilayer ceramic electronic part wherein the substrate body has a lamination structure.

Furthermore, the coefficient of thermal expansion of the substrate body for ceramic electronic parts is preferably not less than about 6.0 ppm/° C.

The present invention is especially advantageous when the metal wiring conductors contain silver.

According to still another aspect of the present invention, a method for manufacturing a multilayer ceramic electronic part is also provided. The method for manufacturing a multilayer ceramic electronic part according to the present invention is characterized in that it comprises the step of preparing a glass-ceramic slurry by adding an organic vehicle to the above-described glass-ceramic composition, the step of preparing an electroconductive paste comprising a metal powder, the step of preparing a green laminate comprising a plurality of glass-ceramic green layers formed and laminated using the glass-ceramic slurry, and metal wiring conductors formed by applying the electroconductive paste to specific members of the glass-ceramic green layers, and the step of baking the green laminate.

To this method, a so-called shrinkage-free process may be applied wherein shrinkage in the direction of the main surface of the glass-ceramic green layers is practically prevented from occurring in the baking step. In this case, the manufacturing method has an additional step of preparing an inorganic material slurry comprising an inorganic material powder that is not sintered at the temperature for sintering the glass-ceramic composition, the step of preparing the green laminate includes the step of forming a constraint layer(s) comprising the inorganic material slurry so that the layer(s) are contacted with the main surface(s) of a specific member(s) of the glass-ceramic green layers, and the step of baking the green laminate is performed at a temperature that causes sintering of the composition but does not cause sintering of the inorganic material powder.

When the above-described shrinkage-free process is applied to the method for manufacturing the multilayer ceramic electronic part, it is preferable to form the constraint layers so that they are located on both ends in the lamination direction of the glass-ceramic green laminated layers during the step of preparing the green laminate, and then to remove the constraint layers after the baking step of the green laminate.

Further objects, features and advantages of the present invention will become apparent from the following description of the preferred embodiments with reference to the attached drawings.

DESCRIPTION OF THE PREFERRED EMBODIMENTS

Figure 1:
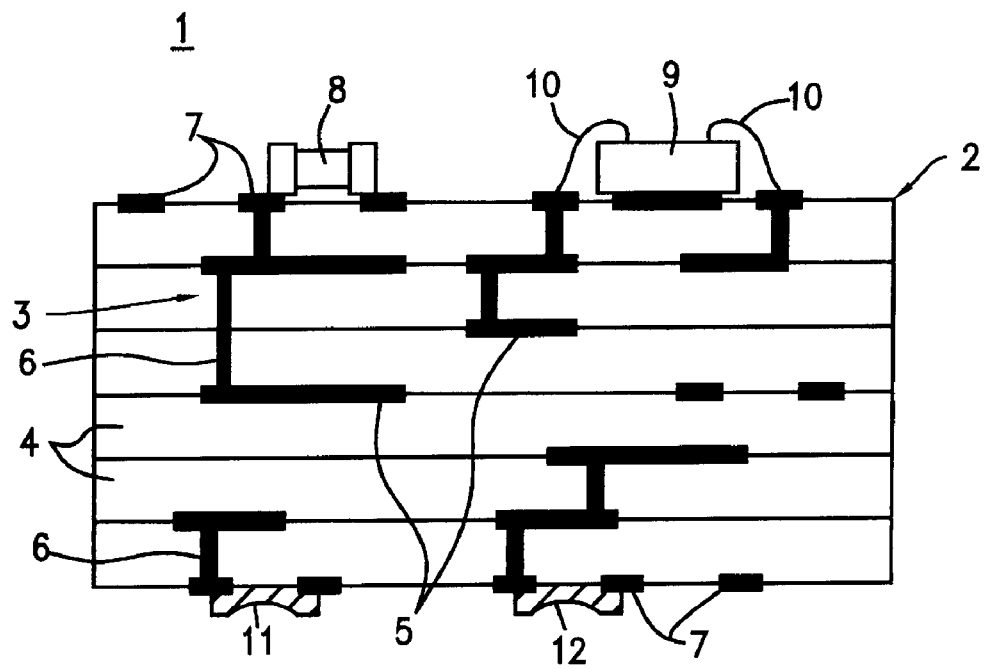
FIG. 1 is a cross-sectional view illustrating a multilayer ceramic substrate 1 as an example of a ceramic electronic part according to one embodiment of the present invention.

FIG. 1 is a cross-sectional view illustrating a multilayer ceramic substrate 1 as an example of a multilayer ceramic electronic part according to one embodiment of the present invention.

The multilayer ceramic substrate 1 has a substrate body 2 obtained by molding a glass-ceramic composition with a specific constitution to be described later, followed by baking, as well as metal wiring conductors 3 formed in association with the substrate body 2 and baked at the same time with the composition.

The substrate body 2 has a lamination structure composed of a plurality of glass-ceramic layers 4. As a member of the metal wiring conductors 3, some internal electroconductive films 5 are formed along the specific interfaces between the glass-ceramic layers 4. Also as a member of the metal wiring conductors 3, some electroconductive via holes 6 are formed, penetrating specific members of the glass-ceramic layers 4. Also as a member of the metal wiring conductors 3, some external electroconductive films 7 are formed on the outer surfaces of the substrate body 2.

Inside the substrate body 2, the internal electroconductive films 5 act as wiring patterns such as strip lines, and also act as passive elements such as inductors and capacitors. The electroconductive via holes 6 act as electric passages for wirings between the glass-ceramic layers 4. The external electroconductive films 7 act as pad electrodes, and also act as wiring patterns.

A surface-mountable chip component 8 and a surface-mountable semiconductor device 9 are mounted on one of the external surfaces of the substrate body 2. The chip component 8 is directly soldered onto specific parts of the external electroconductive films 7 and the semiconductor device 9 is electrically connected to specific parts of the external electroconductive films 7 by means of bonding wires 10. On the other main surface of the substrate body 2, thick-film resistors 11 and 12 are formed and are electrically connected to specific parts of the external electroconductive films 7, respectively.

This multilayer ceramic substrate 1 can be manufactured as follows, for example.

First, a glass-ceramic slurry is prepared by adding an organic vehicle comprising a solvent, a plasticizer and an organic binder to the glass-ceramic composition to be described later, followed by blending.

An electroconductive paste is also prepared for forming the metal wiring conductors 3 including the internal electroconductive films 5, the electroconductive via holes 6 and the external electroconductive films 7. The electroconductive paste is prepared by mixing a metal powder with an organic vehicle, and subjecting the mixture to a dispersion treatment using a three-roll mill or the like.

A metal powder with a low electric resistance, such as gold, silver, copper, silver-palladium, silver-platinum, nickel or aluminum is used as a metal powder contained in the above-described electroconductive paste. When a powder comprising a silver-containing metal such as silver itself or a silver alloy is used as will be described later, the present invention can provide better results.

Next, the above-described glass-ceramic slurry is subjected to sheet formation by means of a doctor blade method or the like. Glass-ceramic green sheets to be used as the glass-ceramic layers 4 are thus formed.

Next, the glass-ceramic green sheets are cut to a specific size. Then, the internal electroconductive films 5, the electroconductive via holes 6 and the external electroconductive films 7 are respectively formed by applying the above-described electroconductive paste to specific glass-ceramic green sheets by screen printing or the like.

Figure 2:
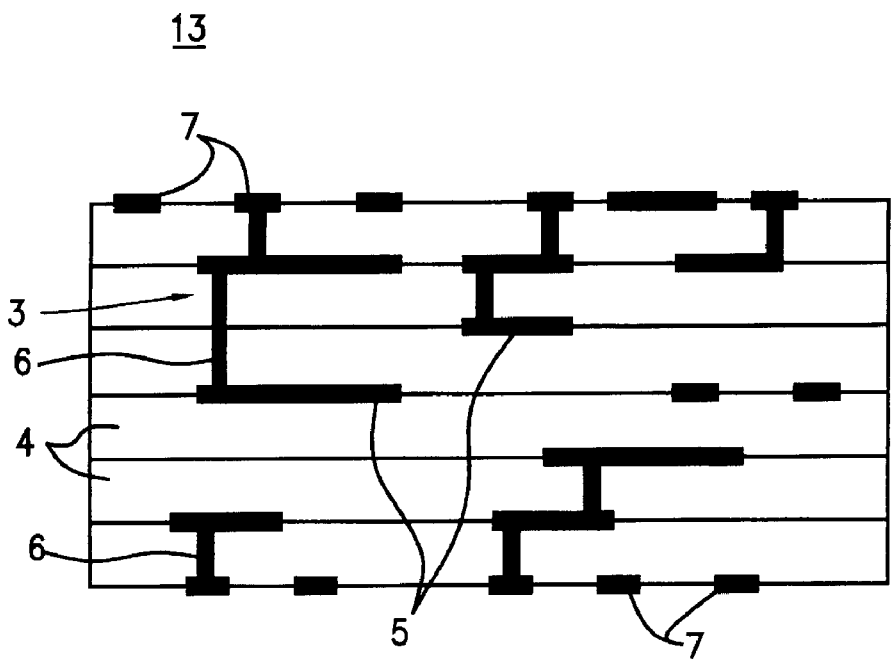
FIG. 2 is a cross-sectional view illustrating a green laminate 13 that is prepared to obtain the multilayer ceramic substrate 1 shown in FIG. 1.

Next, such plural glass-ceramic green sheets are laminated and are subjected to pressing to form a green laminate 13 as shown in FIG. 2.

In the green laminate 13, glass-ceramic green layers 14 are formed by lamination (stacking) of the above-described glass-ceramic green sheets, and the metal wiring conductors 3 including the internal electroconductive films 5, the electroconductive via holes 6, and the external electroconductive films 7 which are formed in association with specific members of the glass-ceramic green layers 14.

Next, the green laminate 13 is baked at a temperature of not more than about 1,000° C., for example at about 800 to 980° C. in air. Accordingly, the substrate body 2 after sintering as shown in FIG. 1 is obtained.

The substrate body 2 is then subjected, for example, to screen printing using a resistor paste, and is baked again to form the thick-film resistors 11 and 12. Then, the multilayer ceramic substrate 1 as shown in FIG. 1 is completed by mounting the chip component 8 and the semiconductor device 9 on the external surface of the substrate body 2.

It is to be noted that when the green laminate 13 having the glass-ceramic green layers 14 laminated as shown in FIG. 2 is prepared, the glass-ceramic green layers 14 may be formed by applying a thick-film printing method to the glass-ceramic slurry instead of the above-described green sheet stacking method for laminating (stacking) the glass-ceramic green sheets formed from the glass-ceramic slurry.

The glass-ceramic composition for substrate body that is to be contained in the glass-ceramic slurry to form the glass-ceramic green layers 14 in the above-described green laminate 13, contains a borosilicate glass powder comprising from about 5% to 17.5% by weight of $B_2O_3$, from about 28% to 44% by weight of $SiO_2$, from 0% to about 20% by weight of $Al_2O_3$, and from about 36% to 50% by weight of MO which is at least one selected from the group consisting of CaO, MgO and BaO, as well as a ceramic powder and an additive powder containing at least one selected from the group consisting of cerium oxide, bismuth, bismuth oxide, antimony and antimony oxide.

Hereupon, it is to be noted that the additive powder comprising at least one selected from the group consisting of cerium oxide, bismuth, bismuth oxide, antimony and antimony oxide is used so as to prevent gray discoloration of the substrate body 2 after the baking. It is also used so as to prevent discoloration of the substrate body 2 into yellow or other colors in the vicinities of the metal wiring conductors 3 when the conductors 3 contain silver.

It is considered that the reason of the above-described discoloration of the substrate body 2 into yellow or other colors by the action of silver (Ag) is that the silver turns into colloids in the glass existing in the substrate body 2. It is, therefore, supposed that the discoloration of the substrate body 2 can be prevented if the Ag colloids are turned into Ag ions by receiving electrons from ions of cerium (Ce), antimony (Sb), or bismuth (Bi).

This will be explained using chemical formulas as follows:

1. When discoloration occurs, it is supposed that the following phenomena have developed.

a. Ag colloids turn into Ag ions by releasing electrons. That is;

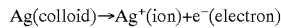
   $Ag(colloid) \rightarrow Ag^+(ion) + e^-(electron)$ b. The Ag ions can receive the electrons again that were released when the Ag colloids turned into Ag ions, and turn back into Ag colloids again. Accordingly, the yellow or other color discoloration remains unchanged. That is;

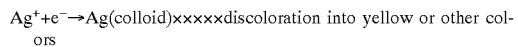
   $Ag^+ + e^- \rightarrow Ag(colloid) \times\times\times\times\times$ discoloration into yellow or other colors 2. It is supposed that the following phenomena occur when the discoloration is prevented by containing a powder comprising at least one selected from the group consisting of cerium oxide, bismuth, bismuth oxide, antimony and antimony oxide:

a. Cerium oxide, bismuth oxide, or antimony dissolves into the glass, and turns into cerium ions, bismuth ions or antimony ions. That is;

| $CeO_2$ | $\rightarrow Ce^{4+} + 4e^-$ |
| $1/2 Bi_2O_3$ | $\rightarrow Bi^{3+} + 3e^-$ |
| $Sb$ | $\rightarrow Sb^{3+} + 3e^-$ | b. The reduction reactions of cerium ions, bismuth ions or antimony ions occur at the same time with the oxidation reaction of Ag colloids. During the course, the Ag colloids turn into ions by releasing electrons and the yellow discoloration of the colloid disappears. In the reactions, respective ions of cerium, bismuth and antimony receive electrons released from Ag colloids, and therefore, electric neutrality is maintained for the cerium, bismuth, and antimony. That is;

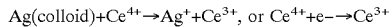

Regarding Bi and Sb, they may turn into five valent ions first, and then into three valent ions. That is;

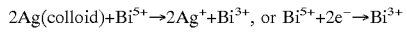

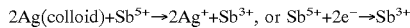

The content of the above-described additive powder is preferably in the range of about 0.005% to 5% by weight based on the total weight of the borosilicate glass powder and the ceramic powder. When the content of the additive powder is less than about 0.005% by weight, there are occasions when the effect of preventing the above-described gray discoloration and discoloration into yellow or other colors is insufficient. On the other hand, when it exceeds about 5% by weight, there are occasions when the density of the substrate body 2 is lowered and the sintering capability becomes poor, and as a result, there may occur problems of poor reliability of the obtained multilayer ceramic substrate 1 such as migration of metals such as Ag contained in the metal wiring conductors 3.

More preferably, the content of the additive powder is in the range of about 0.01 to 1% by weight based on the total weight of the borosilicate glass powder and the ceramic powder. By limiting the content of the additive powder in this way, while maintaining the above-described effects, it is possible to enhance the transverse rupture strength of the obtained substrate body 2 compared with that of a substrate body without the additive powder.

The average particle size of the additive powder is preferably in the range of about 0.1 to 20 $\mu$m. When the average particle size exceeds about 20 $\mu$m, the additive powder may remain as very large particles in the baking step, without reacting with the glass components, and may produce an adverse effect on the mechanical properties and reliability of the obtained substrate body 2. On the other hand, when the average particle size is less than about 0.1 $\mu$m, handling of the additive powder will become difficult and will become unsuited for practical use.

The glass-ceramic composition comprises a borosilicate glass powder and a ceramic powder such as alumina powder as described above. The borosilicate glass is easily crystallized in the baking step by selecting such a specific constitution as described above, and accordingly, acts as a sintering adjuvant, making it possible for the composition to be sintered at a low temperature of not more than about 1,000° C.

In this case, the ratio of borosilicate glass powder to ceramic powder is preferably in the range of about 40:60 to 49:51 by weight. By making the content of borosilicate glass powder less than the content of ceramic powder, it is possible to make the content of crystalline substance higher in the substrate body 2 after sintering, thus realizing a combination of high mechanical strength, high coefficient of thermal expansion of not less than about 6.0 ppm/° C. and low loss.

Furthermore, although crystallization occurred in the glass in the course of baking may generate strains in the substrate body 2, causing warpage and cracks of the substrate body 2 after sintering, the warpage and cracks of the substrate body 2 owing to the crystallization of the glass can be made harder to occur in the course of baking when the content of the borosilicate glass powder is limited to a value not more than about 49% by weight as described above, that is less than the content of the ceramic powder.

On the other hand, a borosilicate glass powder acts as a sintering adjuvant so as to make it possible for the glass-ceramic composition to be sintered at a temperature of not more than about 1,000° C. as described above, on account of its softening and viscous flowing capability developed during the baking step. The content of the borosilicate glass powder is preferably not less than about 40% by weight as described above, so as to secure the function as an adjuvant.

Furthermore, since crystal phases such as wollastonite and anorthite are precipitated easily from the above-described glass components that have been softened and turned into a viscous flow, the substrate body 2 has higher mechanical strength and lower loss after sintering.

The borosilicate glass powder is composed of $B_2O_3$ and $SiO_2$ that are glass network-forming oxides, MO that is a glass network-modifying oxide wherein MO is at least one selected from the group consisting of CaO, MgO and BaO, and $Al_2O_3$ that is a glass network intermediate oxide for facilitating the network-forming function in concert with the network-modifying oxide. These oxides act as sintering adjuvants to make it possible to sinter the glass-ceramic composition at a temperature of not more than about 1,000° C. The ratio is regulated so that precipitation of the crystal phases is facilitated in the baking step.

More particularly, the glass network-forming $B_2O_3$ oxide is for accelerating the viscous flowing capability by lowering the softening point. The range of about 5% to 17.5% by weight is selected for the content as described above. When the content is less than about 5% by weight, a sufficient degree of softening/flowing is not realized for the glass. When it exceeds about 17.5% by weight, the water resistance of the glass becomes insufficient. This may lead to change in quality of the substrate body 2 when used, for example, in a humid atmosphere at a higher temperature. Furthermore, since the Q factor of the glass itself becomes lowered, the Q factor of the thus obtained multilayer ceramic substrate 1 tends to be lower. It is to be noted that the content of $B_2O_3$ is preferably in the range of about 5% to 10% by weight.

Furthermore, the other glass network-forming oxide, $SiO_2$, is the range of about 28% to 44% by weight is selected for the content as described above. When the content of $SiO_2$ is less than about 28% by weight, the dielectric constant of the remaining glass itself becomes higher, preventing the substrate body 2 from acquiring a low dielectric constant. On the other hand, when it exceeds about 44% by weight, the softening/flowing capability of the glass is deteriorated, preventing the glass-ceramic composition from being sintered at a temperature of not more than about 1,000° C. Furthermore, since the crystallization of glass is restricted, the combination of high mechanical strength and low loss cannot be realized. The coefficient of thermal expansion of the substrate body 2 becomes smaller, too. It is to be noted that the content of $SiO_2$ is preferably in the range of about 34% to 44% by weight.

A range of 0% to about 20% by weight is selected for the content of $Al_2O_3$. $Al_2O_3$ acts as a glass network intermediate oxide and stabilizes the glass structure. However, when the content exceeds about 20% by weight, the softening/flowing capability of the glass is deteriorated, it is not possible to sinter the glass-ceramic composition at a temperature not more than about 1,000° C. and the crystallization of glass is restricted, and accordingly, it is not possible to realize the combination of high mechanical strength and low loss. It is to be noted that the content of $Al_2O_3$ is preferably at least about 0.01% by weight. More preferably it is in the range of about 1% to 10% by weight.

The MO is a glass network-modifying oxide, a component that facilitates softening/flowing capability of the glass. The range of about 36% to 50% by weight is selected for the content as described above. When the content of MO is less than about 36% by weight, the softening/flowing capability of the glass is deteriorated and the coefficient of thermal expansion of the obtained substrate body 2 is lowered. On the other hand, when the content exceeds about 50% by weight, the glass structure becomes unstable, making it difficult to obtain glass with consistent qualities. It is to be noted that the content of MO is preferably in the range of about 41% to 49% by weight. Furthermore, CaO is preferable as an MO, since it produces a wollastonite ($CaO.SiO_2$) that has a high Q factor and a relatively high coefficient of thermal expansion in the course of the baking step.

When further facilitation of softening/flowing capability is required in the manufacturing of the glass having the above-described composition, at least one alkali metal oxide selected from the group consisting of $Li_2O$, $K_2O$, and $Na_2O$ may be added in an amount of not more than about 5 parts by weight to 100 parts by weight of the total of $B_2O_3$, $SiO_2$, $Al_2O_3$ and MO as described above. When the amount of the alkali metal oxide exceeds about 5 parts by weight, the electrical insulation property of the glass is decreased, resulting in lowered insulation resistance of the substrate body 2 after sintering. The coefficient of thermal expansion of the substrate body 2 tends to be decreased, too.

It is also desirable to add not more than about 5 parts by weight of at least one compound selected from the group consisting of $TiO_2$, $ZrO_2$, $Cr_2O_3$, $CaF_2$ and CuO, to 100 parts by weight of the total of the above-described $B_2O_3$, $SiO_2$, $Al_2O_3$ and MO, in order to enhance the mechanical strength and to lower the loss of the obtained ceramic substrate by further facilitating crystallization of the glass in the baking step. When the content of the compound exceeds about 5 parts by weight, the dielectric constant of the glass is increased, resulting in a problem that the obtained substrate body 2 has too high a dielectric constant after sintering.

Figure 3:
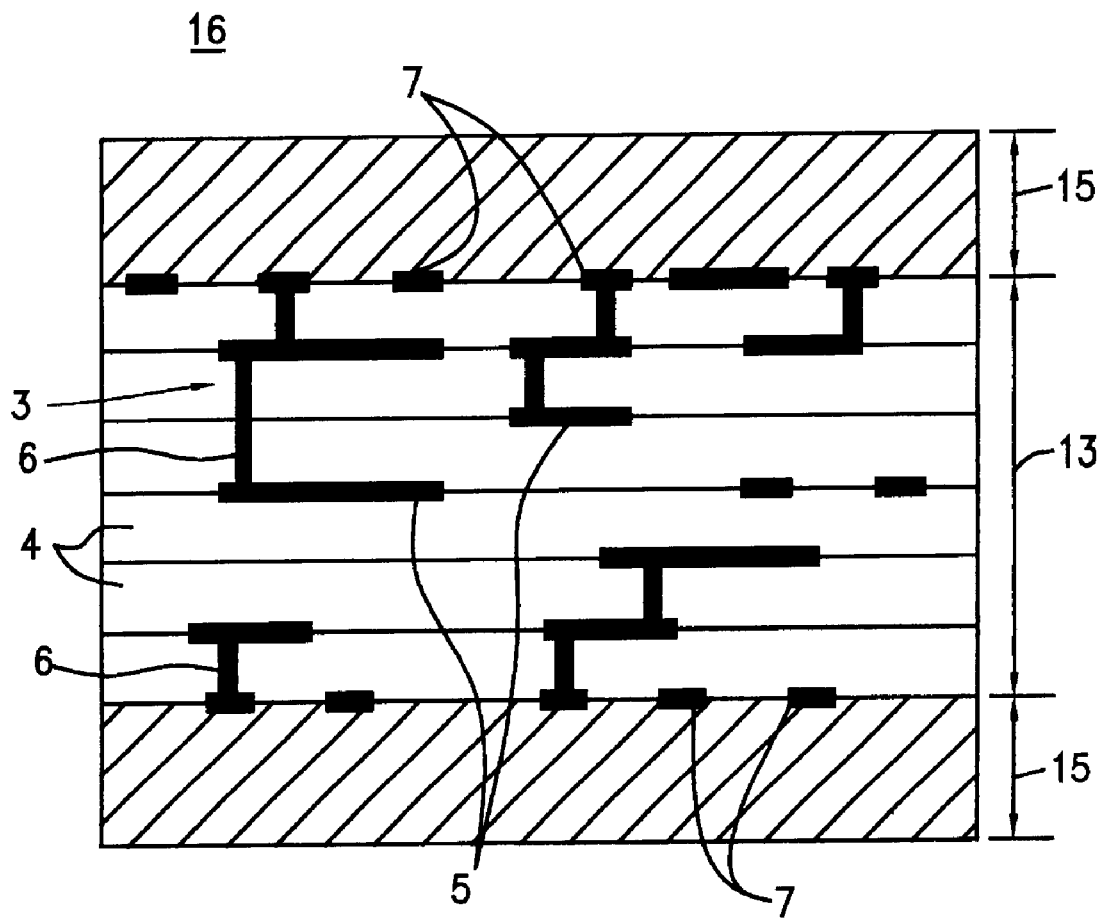
FIG. 3 is a cross-sectional view illustrating the state of the green laminate 13 at the baking step that is prepared to obtain the multilayer ceramic substrate 1 shown in FIG. 1, in order to explain another embodiment of the present invention.

FIG. 3 is a view for explaining another embodiment of the present invention. It illustrates the state of a green laminate 13 in the baking step that is prepared for manufacturing the multilayer ceramic substrate 1 as shown in FIG. 1. Members in FIG. 3 which are the same as those in FIG. 2 are identified by the reference numerals used in FIG. 2, and the corresponding explanations are omitted.

In reference to FIG. 3, constraint layers 15 are formed so that they are contacted with the main surfaces of specific members of the glass-ceramic green layers 14 in the green laminate 13. Particularly in this embodiment, the constraint layers 15 are formed so that they are located on both ends in the direction of lamination of the laminated glass-ceramic green layers 14.

For obtaining a composite construction 16 composed of the green laminate 13 sandwiched with the constraint layers 15 as shown in FIG. 3, an inorganic material powder such as an alumina powder that is not sintered at the temperature for sintering the above-described composition is prepared, and an inorganic material slurry is prepared by adding an organic vehicle to the inorganic material powder. Then, the constraint layers 15 are formed from this inorganic material slurry and the entire composite construction 16 is subjected to pressing in the direction of lamination.

The constraint layers 15 may be formed by forming inorganic material green sheets from the inorganic material slurry, followed by lamination of these sheets over the green laminate 13 or by applying the inorganic material slurry directly on to the green laminate 13.

The above-described composite construction 16 is baked at a temperature that causes sintering of the glass-ceramic composition in the glass-ceramic green layers 14 but does not causes sintering of the inorganic material powder contained in the constraint layers 15.

In the baking step, since the inorganic material powder contained in the constraint layers 15 is not sintered practically, shrinkage does not occur in the constraint layers 15, practically. Accordingly, the constraint layers 15 constrain the green laminate 13, and therefore, the green laminate 13 is practically allowed to shrink only in the thickness direction and the shrinkage in the direction of the main surface is restricted. As a result, it is hard for nonuniform deformation to have occurred in the substrate body 2 after sintering.

The constraint layers 15 are removed after the above-described baking step.

When a multilayer ceramic electronic part such as a multilayer ceramic substrate is manufactured by a so-called shrinkage-free process that uses constraint layers, it is also possible to form a constraint layer(s) along an interface(s) between the glass-ceramic layers constituting the obtained multilayer ceramic electronic part. In this case, the constraint layer(s) are to be left in the product or in the multilayer ceramic electronic part. In the present invention, it is especially preferable to use $Al_2O_3$ as a material for the constraint layers since a reaction product phase is formed between the glass-ceramic composition and $Al_2O_3$ in the constraint layers that can restrict shrinkage at baking of the glass-ceramic composition in the direction of the main surface, and the shrinkage-free process can be performed with good reproducibility.

The following examples were carried out to confirm and explain the effects of the present invention.

EXAMPLE 1

First, $B_2O_3$, $SiO_2$, $Al_2O_3$ and CaO were blended together at a specific ratio, melted in a platinum crucible, and then quenched quickly to form glass strips. The glass strips were then ground with a ball mill to form a borosilicate glass powder.

Next, the borosilicate glass powder, an alumina powder and a cerium oxide powder having an average particle size of 0.1 μm were blended together at contents listed in Table 1. These mixtures were fully blended with a solvent, an organic binder and a plasticizer to form glass-ceramic slurries. Glass-ceramic green sheets were formed from these glass-ceramic slurries according to a doctor blade method.

It is to be noted that in Table 1, the "Content of added glass" or the "Content of added alumina" represents the content of each material in % by weight based on the total of these two materials, and the "Content of added cerium oxide" represents the content of the material in % by weight based on the total of the "Content of added glass" and the "Content of added alumina".

On the other hand, a silver powder, a solvent and an organic binder were blended and the mixture thus formed was subjected to a dispersion treatment with a three-roll mill to form a silver paste.

Next, the silver paste was applied to the glass-ceramic green sheets by screen printing to form electroconductive films with specific patterns. Then, these plural glass-ceramic green sheets were laminated, and were subjected to pressing to form a green laminate.

Next, green laminates thus formed were baked in air to produce sample multilayer ceramic substrates.

The multilayer ceramic substrates thus obtained were subjected to observation of the color of a whole substrate body and whether discoloration occurred in the vicinities of the electroconductive films. The density, transverse rupture strength, dielectric constant and Q factor of the substrate bodies were also measured. Furthermore, the insulation resistance was also measured when a voltage of 50 V was applied for 100 hours at 120° C. in a 95% RH high-temperature, high-humidity chamber. When the insulation resistance is at least $10^{11}$ Ω, it was concluded that the insulation reliability was good ("○"). Otherwise it was evaluated as not good (x).

The results of these observation, measurement, and decision are listed in Table 1.

amount of the borosilicate glass powder and the ceramic powder, as in the cases of Samples 3, 4, 5, 9 and 10, the transverse rupture strength of the substrate body was improved in comparison with Sample 1 that did not contain any cerium oxide powder.

It is to be noted here that when the content of added cerium oxide exceeded about 5% by weight, as in the case of Sample 7 in which the content was 10% by weight, the density of the substrate body was less than 3.00 g/cm$^3$. This is because the sintering capability was deteriorated. This resulted in a deteriorated insulation reliability.

When the content of added cerium oxide was not more than about 5% by weight, as in the cases of Samples 2 to 6, the density of the substrate body was at least 3.00 g/cm$^3$. The insulation reliability was also good.

Furthermore, when the content of added glass was less than about 40% by weight as in the case of Sample 8, in which the content of added glass was 35% by weight, the substrate body was not sintered. When the content of added glass exceeded about 49% by weight as in the cases of Samples 11 and 12, in which the contents of added glass were 50% and 55% by weight, respectively, the substrate body showed warpage.

When the content of added glass was in the range of about 40% to 49% by weight as in the cases of Samples 2 to 6, 9 and 10, the substrate body was sintered sufficiently and no warpage was observed.

EXAMPLE 2

In this Example 2, not only the content of added cerium oxide powder but also the average particle size was changed as shown in Table 2. Sample multilayer ceramic substrates were prepared according to the same procedures as those for

TABLE 1

| Sample No. | Content of added glass (wt. %) | Content of added alumina (wt. %) | Content of added cerium oxide (wt. %) | Color of substrate body | Discoloration in the vicinities of electroconductive films | Density of substrate body (g/cm$^3$) | Transverse rupture strength (MPa) | Dielectric constant | Q factor | Insulation reliability |
|---|---|---|---|---|---|---|---|---|---|---|
| 1 | 45 | 55 | 0 | Gray | Yes | 3.25 | 242 | 8.67 | 263 | ○ |
| 2 | 45 | 55 | 0.005 | White | No | 3.25 | 283 | 8.66 | 265 | ○ |
| 3 | 45 | 55 | 0.01 | White | No | 3.24 | 305 | 8.61 | 270 | ○ |
| 4 | 45 | 55 | 0.1 | White | No | 3.22 | 313 | 8.59 | 278 | ○ |
| 5 | 45 | 55 | 1 | White | No | 3.16 | 256 | 8.34 | 321 | ○ |
| 6 | 45 | 55 | 5 | White | No | 3.02 | 215 | 8.00 | 305 | ○ |
| 7 | 45 | 55 | 10 | White | No | 2.90 | 198 | 7.50 | 281 | x |
| 8 | 35 | 65 | 0.1 | White | No | | | Not sintered. | | |
| 9 | 40 | 60 | 0.1 | White | No | 3.03 | 317 | 8.63 | 282 | ○ |
| 10 | 49 | 51 | 0.1 | White | No | 3.19 | 312 | 8.55 | 272 | ○ |
| 11 | 50 | 50 | 0.1 | White | No | 3.18 | Evaluation not possible on account of warpage. | | | |
| 12 | 55 | 45 | 0.1 | White | No | 3.15 | Evaluation not possible on account of warpage. | | | |

In reference to Table 1, when cerium oxide was added as in the cases of Samples 2 to 12, the substrate body turned white as a whole, and no discoloration by silver was observed in the vicinities of the electroconductive films, even if the content of added cerium oxide was as low as 0.005% by weight.

When no cerium oxide was added as in the case of Sample 1, the substrate body turned gray as a whole, and yellow discoloration was observed in the vicinities of the electroconductive films.

Furthermore, when the content of added cerium oxide was in the range of 0.01% to 1% by weight based on the total Example 1, and were subjected to observation of the color of the substrate bodies and the discoloration in the vicinities of electroconductive films as well as evaluation of the transverse rupture strength and the insulation reliability.

It is to be noted that the ratio of the "Content of added glass" to the "Content of added alumina" was 45:55 for each of the samples, in the same way as shown for Sample 4 in Table 1. In Table 2, the data for Sample 4 are listed again.

TABLE 2

| Sample No. | Content of added cerium oxide (wt. %) | Average particle size of cerium oxide (μm) | Color of substrate body | Discoloration in the vicinities of electroconductive films | Transverse rupture strength (MPa) | Insulation reliability |
|---|---|---|---|---|---|---|
| 4 | 0.1 | 0.1 | White | No | 313 | ○ |
| 13 | 0.1 | 20 | white | No | 286 | ○ |
| 14 | 0.1 | 35 | White | No | 191 | x |
| 15 | 0.01 | 35 | Gray | Yes | 205 | x |

In reference to Table 2, when the average particle size of cerium oxide was in the range of 0.1 to 20 μm as in the cases of Samples 4 and 13, neither gray discoloration of the substrate body nor discoloration in the vicinities of electroconductive films was observed, and good results were realized for the transverse rupture strength and the insulation reliability.

When the average particle size of cerium oxide exceeded about 20 μm as in the case of Sample 14 in which the average particle size was 35 μm, no good results were obtained for the transverse rupture strength and the insulation reliability. Also, when the average particle size of cerium oxide exceeded about 20 μm and the content of added ceramic oxide was low, as in the case of Sample 15 in which the average particle size was 35 μm and the content of added cerium oxide was 0.01% by weight, not only were no good results obtained for the transverse rupture strength and the insulation reliability, but also gray discoloration of the substrate body and discoloration in the vicinities of the electroconductive films were observed. This shows that the effect of cerium oxide was insufficiently produced.

EXAMPLE 3

In this Example 3, a bismuth oxide powder, a bismuth powder, an antimony oxide powder or an antimony powder was used instead of the cerium oxide powder that was used as an additive powder in Example 1.

First, a borosilicate glass powder was prepared by the same procedures as those of Example 1.

Next, the borosilicate glass powder and an alumina powder were blended together so that the former was 45% by weight and the latter was 55% by weight. Furthermore, a bismuth oxide powder, a bismuth powder, an antimony oxide powder or an antimony powder, each having an average particle size of 0.1 μm, was added, respectively, at contents listed in Table 3, wherein the contents are represented as a percentage by weight based on the total weight of the glass powder and the alumina powder. The mixtures thus prepared were subjected to the same procedures as those for Example 1 to form glass-ceramic green sheets.

It is to be noted that the data for Sample 5 shown in Table 1 are listed in Table 3 again. Regarding all the samples in Table 3, the contents of additive powder were selected so that the "Molar number of additive per 100 g" was made to be 0.0058.

After that, a silver paste was prepared, green laminates were prepared, and then, sample multilayer ceramic substrates were prepared according to the same procedures as those for Example 1.

The same observation, evaluation, and decision as those for Example 1 were performed on the multilayer ceramic substrates thus obtained.

The results are shown in Table 3.

TABLE 3

| Sample No. | Additive powder | Content of additive powder (wt. %) | Molar number of additive per 100 g | Color of substrate body | Discoloration in the vicinities of electroconductive films | Density of substrate body (g/cm$^3$) | Transverse rupture strength (MPa) | Dielectric constant | Q factor | Insulation reliability |
|---|---|---|---|---|---|---|---|---|---|---|
| 5 | Cerium oxide | 1.0 | 0.0058 | White | No | 3.16 | 256 | 8.34 | 321 | ○ |
| 16 | Bismuth oxide | 2.7 | 0.0058 | White | No | 3.19 | 251 | 8.43 | 312 | ○ |
| 17 | Bismuth | 1.2 | 0.0058 | White | No | 3.16 | 255 | 8.40 | 315 | ○ |
| 18 | Antimony oxide | 1.7 | 0.0058 | White | No | 3.20 | 250 | 8.43 | 310 | ○ |
| 19 | Antimony | 0.7 | 0.0058 | White | No | 3.15 | 248 | 8.42 | 305 | ○ |

From Table 3, it is understood that when any one of the bismuth oxide powder, bismuth powder, antimony oxide powder or antimony powder was used instead of the cerium oxide powder that was used as an additive powder for Sample 5, as in the cases of Samples 16, 17, 18 and 19, neither gray discoloration of the substrate body nor discoloration in the vicinities of the electroconductive films was observed, and good results were obtained for the density of the substrate body, transverse rupture strength, dielectric constant, Q factor and insulation reliability, just as in the case for Sample 5, as the same molar amount was added as that of added cerium oxide powder in the case of Sample 5.

EXAMPLE 4

In this Example 4, the average particle sizes of the bismuth oxide powder, bismuth powder, antimony oxide powder and antimony powder used for Example 3 were changed as shown in Table 4. Sample multilayer ceramic substrates were prepared by the same procedures as those for Example 3, and the multilayer ceramic substrates thus obtained were subjected to observation of the color of the substrate bodies and the discoloration in the vicinities of electroconductive films as well as evaluation of the transverse rupture strength and the insulation reliability.

It is to be noted that the data for Samples 16, 17, 18 and 19 that are shown in Table 3 are listed in Table 4 again. The glass powder and the alumina powder were blended at a ratio of 45:55 by weight in all of Samples 16 to 27 listed in Table 4, that is, including Samples 16 to 19. The additive powders were added at an amount of 0.0058 mol based on 100 g of the total of the glass powder and the ceramic powder, respectively.

prevented and discoloration of the substrate body into yellow or other colors in the vicinities of the metal wiring conductors containing silver can be prevented, even if this substrate body is baked at the same time with the metal wiring conductors. Thus, the problem in that the commercial value of the ceramic electronic parts thus obtained is degraded by such discoloration can be avoided.

Among the above-described cerium oxide powder, bismuth powder, bismuth oxide powder, antimony powder and antimony oxide powder, the cerium oxide powder is particularly preferred when environmental impact is considered.

TABLE 4

| Sample No. | Additive powder | Average particle size of additive powder (μm) | Color of substrate body | Discoloration in the vicinities of electroconductive films | Transverse rupture strength (MPa) | Insulation reliability |
|---|---|---|---|---|---|---|
| 16 | Bismuth oxide | 0.1 | White | No | 251 | ○ |
| 17 | Bismuth | 0.1 | White | No | 255 | ○ |
| 18 | Antimony oxide | 0.1 | White | No | 250 | ○ |
| 19 | Antimony | 0.1 | White | No | 248 | ○ |
| 20 | Bismuth oxide | 20 | White | No | 240 | ○ |
| 21 | Bismuth | 20 | White | No | 231 | ○ |
| 22 | Antimony oxide | 20 | White | No | 245 | ○ |
| 23 | Antimony | 20 | White | No | 235 | ○ |
| 24 | Bismuth oxide | 35 | Gray | Yes | 198 | x |
| 25 | Bismuth | 35 | Gray | Yes | 188 | x |
| 26 | Antimony oxide | 35 | Gray | Yes | 200 | x |
| 27 | Antimony | 35 | Gray | Yes | 193 | x |

In reference to Table 4, when the average particle size of the bismuth oxide powder, bismuth powder, antimony oxide powder or antimony powder was in the range of about 0.1 to 20 μm respectively, as in the cases of Samples 16 to 23, neither gray discoloration of the substrate body nor discoloration in the vicinities of electroconductive films was observed, and good results were obtained for the transverse rupture strength and the insulation reliability as in the cases of Samples 4 and 13 in Table 2.

When the average particle size exceeded about 20 mm as in the cases of Samples 24 to 27 in which the average particle sizes of the bismuth oxide powder, bismuth powder, antimony oxide powder and antimony powder were 35 mm, not only were no good results obtained for the transverse rupture strength and the insulation reliability, but also gray discoloration of the substrate body and discoloration in the vicinities of the electroconductive films were observed. This shows that the effects of the bismuth oxide powder, bismuth powder, antimony oxide powder and antimony powder were insufficient.

As described above, the glass-ceramic composition for ceramic electronic parts according to the present invention contains a borosilicate glass powder comprising from about 5% to 17.5% by weight of $B_2O_3$, from about 28% to 44% by weight of $SiO_2$, from 0% to about 20% by weight of $Al_2O_3$, and from about 36% to 50% by weight of at least one of CaO, MgO and BaO, as well as a ceramic powder and an additive powder containing at least one selected from the group consisting of cerium oxide, bismuth, bismuth oxide, antimony and antimony oxide. Accordingly, when a substrate body for ceramic electronic parts is prepared from this composition, gray discoloration of the substrate body can be When the content of the additive powder in the glass-ceramic composition according to the present invention is in the range of about 0.005% to 5% by weight based on the total weight of the borosilicate glass powder and the ceramic powder, the above-described gray discoloration of the substrate body and discoloration in the vicinities of the metal wiring conductors can be reliably prevented, while surely preventing the density of the obtained substrate body from decreasing after sintering, and preventing the sintering capability from deteriorating.

Furthermore, when the content of additive powder is in the range of about 0.01% to 1% by weight based on the total weight of the borosilicate glass powder and the ceramic powder, it is possible to have a substrate body with higher transverse rupture strength in comparison with a substrate body without having such an additive powder.

Furthermore, when the average particle size of additive powder is in the range of about 0.1 to 20 μm, the problem of difficulty in handling of the additive powder and the problem of adverse effects of the additive powder on the mechanical properties and reliability of the obtained substrate body can be reliably prevented.

Furthermore, when the range of about 40:60 to 49:51 is selected for the ratio of the borosilicate glass powder to the ceramic powder by weight, the effect of the borosilicate glass powder as a sintering adjuvant can be fully developed, and it is possible to surely prevent the substrate body from warping and cracking on account of strains caused by the crystallization of glass in the substrate body.

Regarding the method for manufacturing a multilayer ceramic electronic part according to the present invention, when the constraint layers comprising an inorganic material powder that is not sintered at the temperature for sintering the glass-ceramic composition are formed so that they are contacted with the main surfaces of specific members of the glass-ceramic green layers, and the baking step is performed at a temperature that causes sintering of the composition but does not cause sintering of the inorganic material powder, then the shrinkage in the direction of the main surface of the glass-ceramic green layers is restricted, with the result that undesirable deformation, warpage, etc. of the obtained multilayer ceramic electronic parts can be restricted, and it is possible to realize metal wiring conductors with higher wiring density in multilayer ceramic electronic parts without problem.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A glass-ceramic composition for a ceramic electronic part comprising:
    a borosilicate glass powder comprising from about 5% to 17.5% by weight of $B_2O_3$, from about 28% to 44% by weight of $SiO_2$, from 0% to about 20% by weight of $Al_2O_3$ and from about 36% to 50% by weight of MO, wherein MO is at least one member selected from the group consisting of CaO, MgO and BaO;
    a ceramic powder; and
    an additive powder comprising at least one member selected from the group consisting of cerium oxide, bismuth, bismuth oxide, antimony and antimony oxide.

2. The glass-ceramic composition for a ceramic electronic part according to claim 1, wherein the content of said additive powder is from about 0.005% to 5% by weight based on the total weight of said borosilicate glass powder and said ceramic powder.

3. The glass-ceramic composition for a ceramic electronic part according to claim 2, wherein the content of said additive powder is from about 0.01% to 1% by weight based on the total weight of said borosilicate glass powder and said ceramic powder.

4. The glass-ceramic composition for a ceramic electronic part according to claim 3, wherein the average particle size of said additive powder is from about 0.1 to 20 $\mu$m.

5. The composition for a ceramic electronic part according to claim 4, wherein the ratio of said borosilicate glass powder to said ceramic powder is from about 40:60 to 49:51 by weight.

6. The glass-ceramic composition for a ceramic electronic part according to claim 5, wherein said ceramic powder comprises an alumina powder.

7. The glass-ceramic composition for a ceramic electronic part according to claim 6, wherein the borosilicate glass powder comprises from about 5% to 10% by weight of $B_2O_3$, from about 34% to 44% by weight of $SiO_2$, from about 0.01% to 20% by weight of $Al_2O_3$ and from about 41% to 49% by weight of CaO; and the additive powder comprises cerium oxide.

8. The glass-ceramic composition for a ceramic electronic part according to claim 1, wherein the content of said additive powder is from about 0.01% to 1% by weight based on the total weight of said borosilicate glass powder and said ceramic powder.

9. The glass-ceramic composition for a ceramic electronic part according to claim 1, wherein the average particle size of said additive powder is from about 0.1 to 20 $\mu$m.

10. The composition for a ceramic electronic part according to claim 1, wherein the ratio of said borosilicate glass powder to said ceramic powder is from about 40:60 to 49:51 by weight.

11. The glass-ceramic composition for a ceramic electronic part according to claim 1, wherein said ceramic powder comprises an alumina powder.

12. A ceramic electronic part comprising:
    a substrate body comprising a baked and molded glass-ceramic composition according to claim 7, and
    a metal wiring conductor comprising silver disposed in association with said substrate body.

13. A ceramic electronic part comprising:
    a substrate body comprising a baked and molded glass-ceramic composition according to claim 1, and
    a metal wiring conductor disposed in association with said substrate body.

14. The ceramic electronic part according to claim 13, wherein said substrate body is a laminate and said ceramic electronic part is a multilayer ceramic electronic part.

15. The ceramic electronic part according to claim 13, wherein the coefficient of thermal expansion of said substrate body is not less than about 6.0 ppm/° C.

16. The ceramic electronic part according to claim 13, wherein said metal wiring conductor comprises silver.

17. A method for manufacturing a multilayer ceramic electronic part comprising
    providing a glass-ceramic slurry comprising an organic vehicle and a glass-ceramic composition according to claim 1;
    providing an electroconductive paste comprising a metal powder;
    preparing a green laminate comprising a plurality of glass-ceramic green layers formed and laminated utilizing said glass-ceramic slurry as well as metal wiring conductors formed by applying said electroconductive paste to selected areas of said glass-ceramic green layers; and
    baking said green laminate.

18. The method for manufacturing a multilayer ceramic electronic part according to claim 17, wherein:
    said method further comprises providing an inorganic material slurry comprising an inorganic material powder that is not sintered at the temperature for sintering said glass-ceramic composition;
    said preparing a green laminate includes forming a constraint layer comprising said inorganic material slurry so that the constraint layer is in contact with a main surface of a glass-ceramic green layer; and
    said step of baking the green laminate is performed at a temperature that causes sintering of said glass-ceramic composition but does not cause sintering of said inorganic material powder.

19. The method for manufacturing a multilayer ceramic electronic part according to claim 18, wherein:
    said constraint layer is formed so as to be located on both ends in the lamination direction of said laminated glass-ceramic green layers when preparing the green laminate; and
    said constraint layer is removed after said baking the green laminate.

* * * * *